United States Patent
Zhuang (10) Patent No.: US 10,110,214 B2
(45) Date of Patent: Oct. 23, 2018

(54) VOLTAGE COMPARATOR CIRCUIT INCLUDING A PLURALITY OF VOLTAGE CONTROLLED DELAY LINES

(71) Applicant: STMICROELECTRONICS (RESEARCH & DEVELOPMENT) LIMITED, Marlow (GB)

(72) Inventor: Caixin Zhuang, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 15/403,631

(22) Filed: Jan. 11, 2017

(65) Prior Publication Data

US 2018/0198440 A1 Jul. 12, 2018

(51) Int. Cl.
*H03K 3/02* (2006.01)
*H03K 5/24* (2006.01)
*H03K 3/037* (2006.01)
*H03K 5/00* (2006.01)

(52) U.S. Cl.
CPC .......... *H03K 5/2481* (2013.01); *H03K 3/037* (2013.01); *H03K 5/249* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 7,474,136 B2* | 1/2009 | Heightley | ............ | G11C 7/1051 327/158 |
| 2009/0085624 A1* | 4/2009 | Yoon | ...................... | H03K 3/017 327/175 |
| 2010/0182054 A1* | 7/2010 | Ooyagi | .................. | H03K 4/502 327/131 |
| 2011/0018584 A1* | 1/2011 | Teh | .................. | H03K 3/356156 326/95 |
| 2011/0080200 A1* | 4/2011 | Zhou | ........................ | H03K 3/64 327/172 |
| 2011/0131440 A1* | 6/2011 | Noda | ...................... | H03K 5/133 713/401 |
| 2011/0298514 A1* | 12/2011 | Hopkins | ............. | H02M 1/0845 327/176 |
| 2012/0081143 A1* | 4/2012 | Behrends | ................ | G06F 7/588 326/8 |
| 2012/0229179 A1* | 9/2012 | Sano | ........................ | H03L 7/08 327/115 |
| 2012/0262240 A1* | 10/2012 | Cremonesi | ........... | H03K 3/0315 331/57 |

(Continued)

*Primary Examiner* — Lincoln Donovan
*Assistant Examiner* — Khareem E Almo
(74) *Attorney, Agent, or Firm* — Slater Matsil, LLP (57) ABSTRACT

An embodiment circuit includes a first voltage-controlled delay line (VCDL), a second VCDL, and a first flip-flop. The first VCDL includes a first input terminal configured to receive a first input voltage, and a second input terminal configured to receive a clock signal. The second VCDL includes a first input terminal configured to receive a second input voltage, and a second input terminal configured to receive the clock signal. The first flip-flop includes a reset pin coupled to an output terminal of the first VCDL, and a clock pin coupled to an output terminal of the second VCDL.

20 Claims, 4 Drawing Sheets

(56) References Cited

U.S. PATENT DOCUMENTS

| | | | |
|---|---|---|---|
| 2013/0223152 A1* | 8/2013 | Passerini | H03K 3/011 365/185.18 |
| 2014/0312938 A1* | 10/2014 | Jung | H03K 5/00006 327/119 |
| 2015/0155857 A1* | 6/2015 | Byeon | H03K 3/0375 327/218 |
| 2015/0288363 A1* | 10/2015 | Riexinger | G06F 1/04 327/225 |
| 2015/0365078 A1* | 12/2015 | Seo | H03L 7/085 327/158 |
| 2016/0094212 A1* | 3/2016 | Kordik | H03K 5/24 327/77 |
| 2017/0047917 A1* | 2/2017 | Heo | H03K 5/131 |
| 2017/0230052 A1* | 8/2017 | Jeong | H03L 7/0891 |
| 2017/0338825 A1* | 11/2017 | Lee | H03L 7/0818 |
| 2017/0352392 A1* | 12/2017 | Lee | G11C 5/02 |

\* cited by examiner

VOLTAGE COMPARATOR CIRCUIT INCLUDING A PLURALITY OF VOLTAGE CONTROLLED DELAY LINES

TECHNICAL FIELD

The present disclosure relates generally to voltage comparators, and, in particular embodiments, to a voltage comparator circuit including a plurality of voltage-controlled delay lines.

BACKGROUND

A voltage comparator (hereinafter referred to as a comparator) is a commonly used circuit in complementary metal oxide semiconductor (CMOS) circuit design (e.g. in analog circuit design). As an example, comparators are used in analog-to-digital converters (ADCs). A comparator produces an output voltage in response to a potential difference between its input terminals, which may be referred to an input differential voltage. If a potential difference between its first input terminal and its second input terminal is positive, the comparator may output a first output voltage (e.g. a logical HIGH or binary logic 1). On the other hand, if a potential difference between its first input terminal and its second input terminal is negative, the comparator may output a second output voltage (e.g. a logical LOW or binary logic 0). A comparator can be implemented using an open-loop operational amplifier or a latched comparator, as examples.

Design of a comparator circuit may require a trade-off among various aspects, including power consumption, speed (e.g. the time it takes for the comparator to produce the correct output after a potential difference is presented at its inputs), circuit layout area, accuracy (e.g. the minimum input potential difference required for the comparator to make a correct decision), complexity of implementation, and scalability with CMOS technology nodes, as examples. It may be desirable to have comparator circuits that are able to operate at high speeds (e.g. for high frequency applications) even for small input differential voltages (e.g. about 1 mV or below). It may also be desirable to have comparator circuits that consume low power, require a low supply voltage, and have low design complexity.

SUMMARY

In an embodiment, a circuit includes a first voltage-controlled delay line (VCDL), a second VCDL, and a first flip-flop. The first VCDL includes a first input terminal configured to receive a first input voltage, and a second input terminal configured to receive a clock signal. The second VCDL includes a first input terminal configured to receive a second input voltage, and a second input terminal configured to receive the clock signal. The first flip-flop includes a reset pin coupled to an output terminal of the first VCDL, and a clock pin coupled to an output terminal of the second VCDL.

In an embodiment, a circuit includes a first voltage-controlled delay line (VCDL). The first VCDL includes a first inverter; a second inverter; a first capacitive element; a first current source; and a first switch. The first inverter includes an input configured to receive a clock signal, and a first power terminal configured to be coupled to a first supply voltage. The second inverter includes an input coupled to an output of the first inverter, a first power terminal configured to be coupled to the first supply voltage, and a second power terminal configured to be coupled to a ground potential. The first capacitive element is coupled between an output of the first inverter and the ground potential. The first current source is coupled between a second power terminal of the first inverter and the ground potential, where the first current source is configured to be controlled by a first input voltage. The first switch is coupled between the first supply voltage and the second power terminal of the first inverter, where the first switch is configured to be controlled by the clock signal, and where an output of the second inverter is an output of the first VCDL.

In an embodiment, a method includes delaying, by a first voltage-controlled delay line (VCDL), a rising edge of a clock signal by a first time delay based on a first input voltage received at the first VCDL, where the delaying produces a first delayed signal. The method also includes delaying, by a second VCDL, the rising edge of the clock signal by a second time delay based on a second input voltage received at the second VCDL, where the delaying produces a second delayed signal. The method additionally includes triggering a reset pin of a first flip-flop using the first delayed signal; and triggering a clock pin of the first flip-flop using the second delayed signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Figures 1, 6, 7:
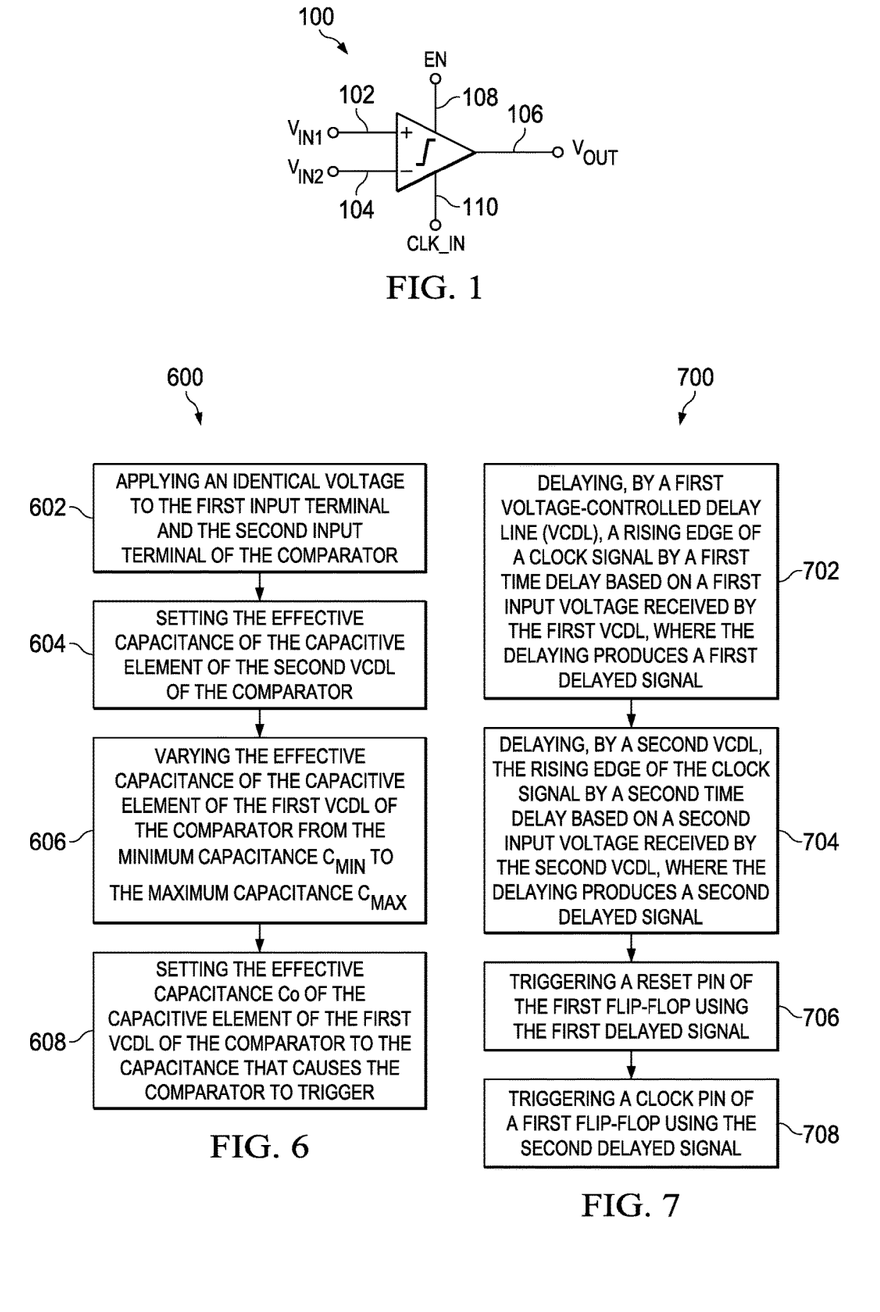
FIG. 1 shows a comparator, in accordance with an embodiment.
FIG. 6 shows a method of determining the effective capacitances of capacitive elements of each of a first VCDL and a second VCDL, in accordance with an embodiment.
FIG. 7 shows a method of generating an output voltage based on a comparison of a first input voltage and a second input voltage, in accordance with an embodiment.

FIG. 1 shows a comparator 100, in accordance with an embodiment. The comparator 100 includes a first input terminal 102 (e.g. a non-inverting input), a second input terminal 104 (e.g. an inverting input), and an output terminal 106. The first input terminal 102 may be configured to receive a first input voltage $V_{IN1}$, while the second input terminal 104 may be configured to receive a second input voltage $V_{IN2}$. In some embodiments, the first input voltage $V_{IN1}$ and the second input voltage $V_{IN2}$ may be analog voltages respectively provided to the first input terminal 102 and the second input terminal 104 of the comparator 100.

The comparator 100 may be configured to produce an output voltage $V_{OUT}$ at the output terminal 106 of the comparator 100 in response to a comparison between the first input voltage $V_{IN1}$ and the second input voltage $V_{IN2}$. In other words, the comparator 100 may be configured to compare two analog voltages (e.g. the first and second input voltages $V_{IN1}$ and $V_{IN2}$) and generate a digital output (e.g. the output voltage $V_{OUT}$) in response to the comparison. For example, in response to the first input voltage $V_{IN1}$ being greater than the second input voltage $V_{IN2}$, the output voltage $V_{OUT}$ may be at a first output voltage or a first logic level (e.g. logical HIGH or binary logic 1). On the other hand, the output voltage $V_{OUT}$ may be at a second output voltage or a second logic level (e.g. logical LOW or binary logic 0) in response to the first input voltage $V_{IN1}$ being less than the second input voltage $V_{IN2}$. In some examples, the second input voltage $V_{IN2}$ may be provided as a reference voltage (e.g. a constant reference voltage) to the second input terminal 104 of the comparator 100.

As depicted in FIG. 1, the comparator 100 may additionally include an enable pin 108, which may be configured to receive an enable signal EN. The enable signal EN may be an asynchronous digital enable signal. The comparator 100 may be configured to produce the output voltage $V_{OUT}$ based on the comparison between the first input voltage $V_{IN1}$ and the second input voltage $V_{IN2}$ when the enable signal EN is at a first voltage or a first logic level (e.g. binary logic 1). However, when the enable signal EN is at a second voltage or a second logic level (e.g. binary logic 0), the output voltage $V_{OUT}$ of the comparator 100 may be held at a constant voltage or a constant logic level (e.g. binary logic 0). Stated differently, the enable signal EN may be configured to enable operation of the comparator 100 such that the output voltage $V_{OUT}$ produced at the output terminal 106 of the comparator 100 is based on the comparison between the first input voltage $V_{IN1}$ and the second input voltage $V_{IN2}$. The comparator 100 further includes a clock pin 110 configured to receive a first input clock signal CLK_IN. In some embodiments, the output voltage $V_{OUT}$ produced at the output terminal 106 of the comparator 100 may be updated at the rising edges of the first input clock signal CLK_IN.

Figure 2:
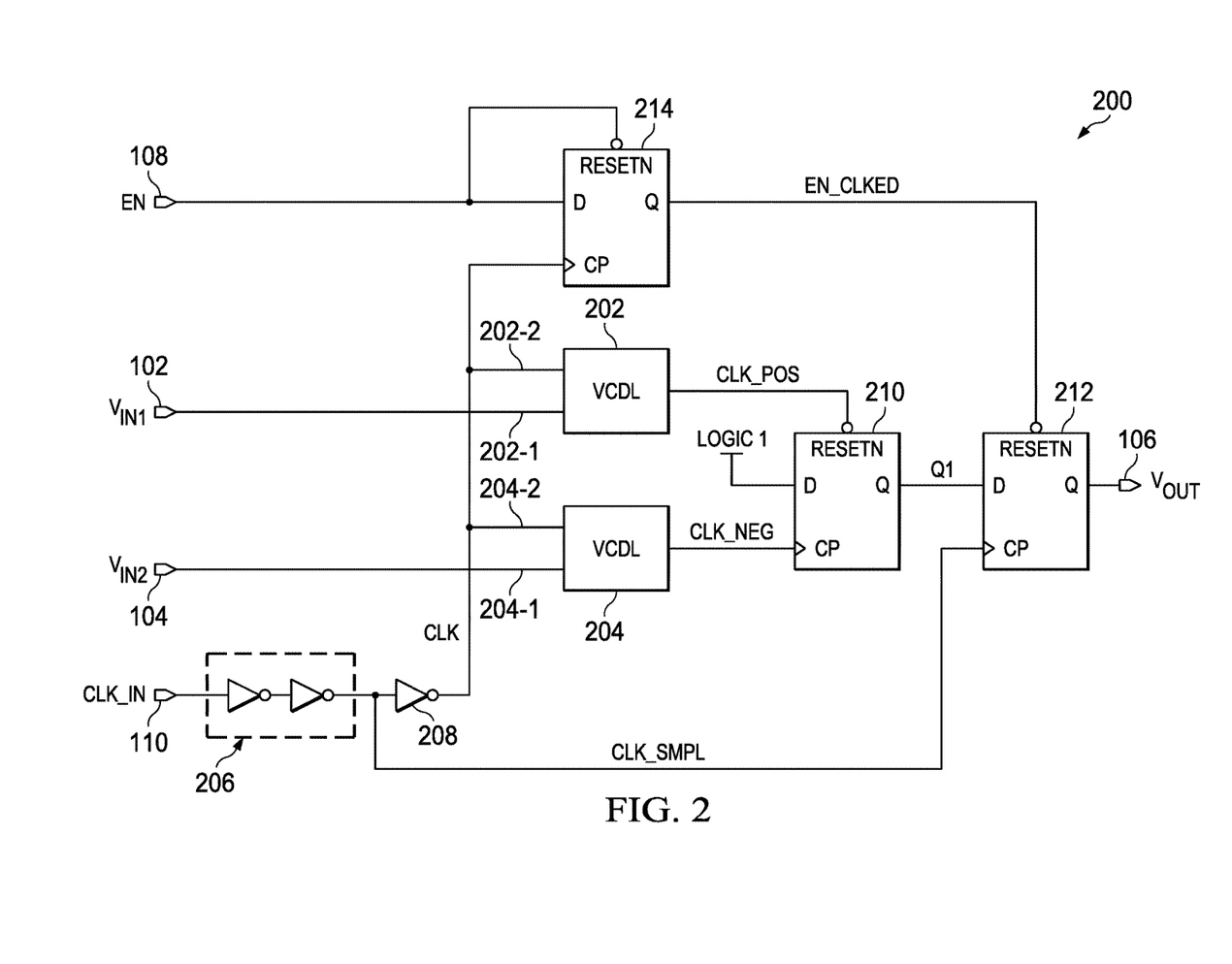
FIG. 2 shows the internal circuitry of the comparator shown in FIG. 1, in accordance with an embodiment.
Figure 3:
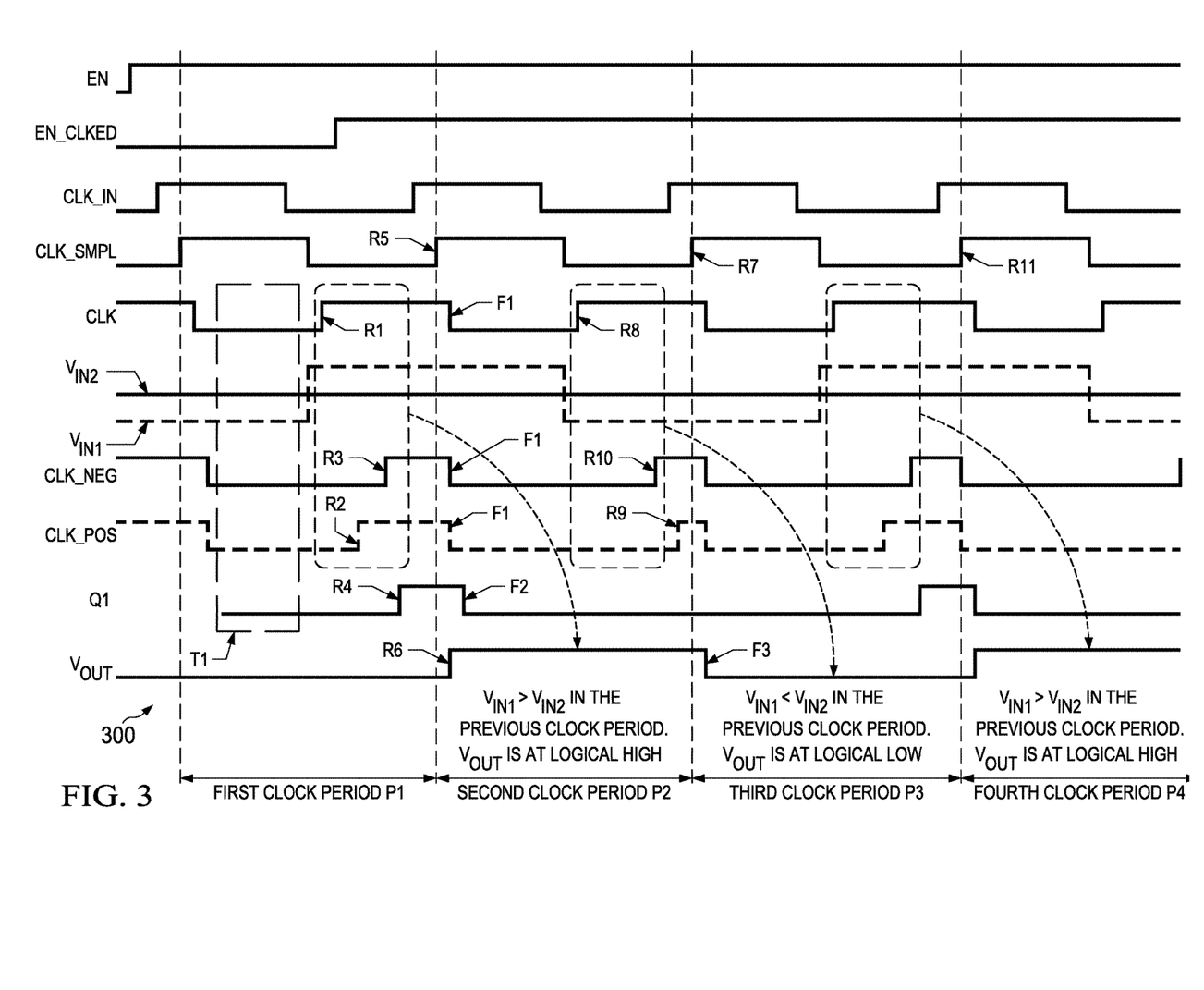
FIG. 3 shows a timing diagram illustrating the relative timings of pulses provided to and generated by the internal circuitry shown in FIG. 2, in accordance with an embodiment.

FIG. 2 shows the internal circuitry 200 of the comparator 100 shown in FIG. 1, in accordance with an embodiment. Furthermore, FIG. 3 shows a timing diagram 300 illustrating the relative timings of pulses provided to and generated by the internal circuitry 200 shown in FIG. 2, in accordance with an embodiment. In the examples shown in FIGS. 2 and 3, the second input voltage $V_{IN2}$ is provided as a reference voltage (e.g. a constant reference voltage) to the second input terminal 104 of the comparator 100, while the amplitude of the first input voltage $V_{IN1}$ varies with time.

As depicted in FIG. 2, the comparator 100 includes the first input terminal 102, the second input terminal 104, the output terminal 106, the enable pin 108, and the clock pin 110. As described above in respect of FIG. 1, the first input voltage $V_{IN1}$, second input voltage $V_{IN2}$, enable signal EN, and first input clock signal CLK_IN are provided to the first input terminal 102, second input terminal 104, enable pin 108, and clock pin 110, respectively. Additionally, the output voltage $V_{OUT}$ is produced at the output terminal 106.

The comparator 100 further includes a first voltage-controlled delay line (VCDL) 202 and a second VCDL 204. A first input terminal 202-1 of the first VCDL 202 may be configured to receive the first input voltage $V_{IN1}$, while a first input terminal 204-1 of the second VCDL 204 may be configured to receive the second input voltage $V_{IN2}$. In other words, the first input terminal 202-1 of the first VCDL 202 may be the first input terminal 102 of the comparator 100, while the first input terminal 204-1 of the second VCDL 204 may be the second input terminal 104 of the comparator 100. A second input terminal 202-2 of the first VCDL 202 and a second input terminal 204-2 of the second VCDL 204 may each be configured to receive a second input clock signal CLK, which may be generated from the first input clock signal CLK_IN.

The comparator 100 includes a buffer 206 that is configured to receive the first input clock signal CLK_IN as an input and produce a buffered clock signal CLK_SMPL as an output. In the embodiment shown in FIG. 2, the buffer 206 is implemented by two inverters connected in series. In such an implementation, the buffered clock signal CLK_SMPL may be a delayed version of the first input clock signal CLK_IN, and this is shown in the timing diagram 300 of FIG. 3. Additionally, the buffered clock signal CLK_SMPL may be provided as an input to an inverter 208, which outputs the second input clock signal CLK. As such, the second input clock signal CLK may be a delayed and inverted version of the buffered clock signal CLK_SMPL, and this is also shown in the timing diagram 300 of FIG. 3. The second input clock signal CLK is subsequently provided as an input to the first VCDL 202 and the second VCDL 204 (e.g. to the second input terminals 202-2 and 204-2 of the VCDLs 202 and 204).

The first VCDL 202 may be configured to produce a first delayed pulse CLK_POS based on the amplitude of the first input voltage $V_{IN1}$. For example, the first VCDL 202 may be configured to delay a rising edge of the second input clock signal CLK based on the amplitude of the first input voltage $V_{IN1}$ to produce the first delayed pulse CLK_POS. Other portions (e.g. a falling edge) of the second input clock signal CLK may pass through the first VCDL 202 substantially unperturbed. For example, for the VCDL design discussed herein, a constant delay, regardless of the amplitude of the first input voltage $V_{IN1}$, may be added to a falling edge of the second input clock signal CLK, but this falling edge delay is typically negligible and may be ignored for the analysis for the circuit operation. As such, rising edges of the first delayed pulse CLK_POS may be delayed relative to rising edges of the second input clock signal CLK, while falling edges of the first delayed pulse CLK_POS may be temporally aligned with falling edges of the second input clock signal CLK (e.g. as shown in the timing diagram 300 of FIG. 3). In other words, the falling edges of the first delayed pulse CLK_POS may be synchronized with falling edges of the second input clock signal CLK.

Similarly, the second VCDL 204 may be configured to produce a second delayed pulse CLK_NEG based on the amplitude of the second input voltage $V_{IN2}$. For example, the second VCDL 204 may be configured to delay a rising edge of the second input clock signal CLK based on the amplitude of the second input voltage $V_{IN2}$ to produce the second delayed pulse CLK_NEG. Other portions (e.g. a falling edge) of the second input clock signal CLK may pass through the second VCDL 204 substantially unperturbed. For example, for the VCDL design discussed herein, a constant delay, regardless of the amplitude of the second input voltage $V_{IN2}$, may be added to a falling edge of the second input clock signal CLK, but this falling edge delay is typically negligible and may be ignored for the analysis for the circuit operation. As such, rising edges of the second delayed pulse CLK_NEG may be delayed relative to rising edges of the second input clock signal CLK, while falling edges of the second delayed pulse CLK_NEG may be temporally aligned with falling edges of the second input clock signal CLK (e.g. as shown in the timing diagram 300 of FIG. 3). In other words, the falling edges of the second delayed pulse CLK_NEG may be synchronized with falling edges of the second input clock signal CLK.

In some embodiments, the delay added by the first VCDL 202 and the second VCDL 204 to the rising edge of the second input clock signal CLK may be inversely proportional to the amplitudes of the first input voltage $V_{IN1}$ and the second input voltage $V_{IN2}$. In such embodiments, the rising edge of the second input clock signal CLK may be delayed by a greater extent in response to lower amplitudes of the first input voltage $V_{IN1}$ and the second input voltage $V_{IN2}$. In other embodiments, however, the delay added to the rising edge of the second input clock signal CLK may be directly proportional to the amplitudes of the first input voltage $V_{IN1}$ and the second input voltage $V_{IN2}$. In such embodiments, the rising edge of the second input clock signal CLK may be delayed by a greater extent in response to greater amplitudes of the first input voltage $V_{IN1}$ and the second input voltage $V_{IN2}$. In the example shown in FIG. 3, the delay added to the rising edge of the second input clock signal CLK is inversely proportional to the amplitudes of the first input voltage $V_{IN1}$ and the second input voltage $V_{IN2}$. For example, in a first clock period P1 shown in FIG. 3, the amplitude of the second input voltage $V_{IN2}$ is smaller than the amplitude of the first input voltage $V_{IN1}$ at the time of a rising edge R1 of the second input clock signal CLK. Thus, the second VCDL 204 adds a greater delay to the rising edge R1 of the second input clock signal CLK than the first VCDL 202, which adds a smaller delay to the rising edge R1 of the second input clock signal CLK. Accordingly, a rising edge R2 of the first delayed pulse CLK_POS arrives earlier in time than a rising edge R3 of the second delayed pulse CLK_NEG.

Referring back to FIG. 2, the internal circuitry 200 of the comparator 100 also includes a first flip-flop 210, which may be implemented using a D flip-flop. The first flip-flop 210 may include a reset pin RESETN, a data input pin D, a clock pin CP, and an output pin Q. The first flip-flop 210 may be coupled to the first VCDL 202. In particular, the reset pin RESETN of the first flip-flop 210 may be coupled to an output of the first VCDL 202 such that the first delayed pulse CLK_POS is received at the reset pin RESETN of the first flip-flop 210. In response to the first delayed pulse CLK_POS being at a logical LOW (e.g. binary logic 0), the first flip-flop 210 is in a reset state, and a logical LOW is generated at the output pin Q regardless of the binary logic at the data input pin D of the first flip-flop 210. However, in response to the first delayed pulse CLK_POS being at a logical HIGH (e.g. binary logic 1), the binary logic at the data input pin D of the first flip-flop 210 is propagated to the output pin Q of the first flip-flop 210 when a rising edge occurs at the clock pin CP of the first flip-flop 210. In the example shown in FIG. 2, the data input pin D of the first flip-flop 210 is configured to receive a logical HIGH (e.g. binary logic 1), and this may be accomplished by coupling the data input pin D of the first flip-flop 210 to a supply voltage.

The first flip-flop 210 may also be coupled to the second VCDL 204. In particular, the clock pin CP of the first flip-flop 210 may be coupled to an output of the second VCDL 204 such that the second delayed pulse CLK_NEG is received at the clock pin CP of the first flip-flop 210. In some embodiments, such as in the example of FIGS. 2 and 3, the first flip-flop 210 may be a positive edge-triggered flip-flop that generates the binary logic at the output pin Q of the first flip-flop 210 in response to a rising edge of the second delayed pulse CLK_NEG received at the clock pin CP of the first flip-flop 210.

The internal circuitry 200 of the comparator 100 further includes a second flip-flop 212. Similar to the first flip-flop 210, the second flip-flop 212 may be implemented using a D flip-flop. The second flip-flop 212 may include a reset pin RESETN, a data input pin D, a clock pin CP, and an output pin Q. The second flip-flop 212 may be coupled to the first flip-flop 210. In particular, the data input pin D of the second flip-flop 212 may be coupled to the output pin Q of the first flip-flop 210. Additionally, the clock pin CP of the second flip-flop 212 may be coupled to an output of the buffer 206 such that the buffered clock signal CLK_SMPL is received at the clock pin CP of the second flip-flop 212. Furthermore, the output pin Q of the second flip-flop 212 may be the output terminal 106 of the comparator 100 such that the output voltage $V_{OUT}$ is generated at the output pin Q of the second flip-flop 212.

The internal circuitry 200 of the comparator 100 further includes a third flip-flop 214. Similar to the first flip-flop 210, the third flip-flop 214 may be implemented using a D flip-flop. The third flip-flop 214 may include a reset pin RESETN, a data input pin D, a clock pin CP, and an output pin Q. The data input pin D and the reset pin RESETN of the third flip-flop 214 may be configured to receive the enable signal EN. In response to the enable signal EN being at a logical LOW (e.g. binary logic 0), the third flip-flop 214 is in a reset state, and a logical LOW is generated at the output pin Q of the third flip-flop 214. However, in response to the enable signal EN being at a logical HIGH (e.g. binary logic 1), the binary logic at the data input pin D of the third flip-flop 214 (namely, the enable signal EN at logical HIGH) is propagated to the output pin Q of the third flip-flop 214. The third flip-flop 214 may also be configured to receive the second input clock signal CLK at the clock pin CP.

The third flip-flop 214 may be coupled to the second flip-flop 212. In particular, the output pin Q of the third flip-flop 214 may be coupled to the reset pin RESETN of the second flip-flop 212. As such, the third flip-flop 214 may provide a clocked enable signal EN_CLKED to the second flip-flop 212 (e.g. to avoid meta-stability issues). In response to the clocked enable signal EN_CLKED being at a logical LOW (e.g. binary logic 0), the second flip-flop 212 is in a reset state, and a logical LOW is generated at the output pin Q of the second flip-flop 212 regardless of the binary logic at the data input pin D of the second flip-flop 212. However, in response to the clocked enable signal EN_CLKED being at a logical HIGH (e.g. binary logic 1), the binary logic at the data input pin D of the second flip-flop 212 is propagated to the output pin Q of the second flip-flop 212 when a rising edge occurs at the clock pin CP of the first flip-flop 212. The time delay between a rising edge of the second input clock signal CLK and a rising edge of the clocked enable signal EN_CLKED (also referred to as a "rising edge delay") is less than the time delay between the rising edge of the second input clock signal CLK and a rising edge of the voltage Q1 at the output pin Q of the first flip-flop 210. In this way, the second flip-flop 212 is out of a reset state before the first valid data arrival to the voltage Q1 at the output pin Q of the first flip-flop 210.

During an initial operation of the comparator 100, which depicted in FIG. 3 as time segment T1 in the first clock period P1, the second input clock signal CLK, the first delayed pulse CLK_POS, and the second delayed pulse CLK_NEG are at a logical LOW (e.g. binary logic 0), and consequently, a voltage Q1 at the output pin Q of the first flip-flop 210 is also at a logical LOW (e.g. binary logic 0).

As shown in FIG. 3, during the first clock period P1, when the rising edge R1 occurs in the second input clock signal CLK, the first input voltage $V_{IN1}$ is greater than the second input voltage $V_{IN2}$. Since the first VCDL 202 and the second VCDL 204 are configured such that the delay added to the rising edge R1 of the second input clock signal CLK is inversely proportional to the amplitudes of the first input voltage $V_{IN1}$ and the second input voltage $V_{IN2}$, the rising edge R2 of the first delayed pulse CLK_POS arrives at the first flip-flop 210 earlier in time than the rising edge R3 of the second delayed pulse CLK_NEG. Consequently, the first flip-flop 210 is not in a reset state when the rising edge R3 of the second delayed pulse CLK_NEG is received at the clock pin CP of the first flip-flop 210. Accordingly, the logical HIGH (e.g. binary logic 1) at the data input pin D of the first flip-flop 210 is clocked to the output pin Q of the first flip-flop 210. Therefore, the voltage Q1 at the output pin Q of the first flip-flop 210 transitions from a logical LOW (e.g. binary logic 0) to a logical HIGH (e.g. binary logic 1). This transition of the voltage Q1 at the output pin Q of the first flip-flop 210 is indicated in FIG. 3 as a rising edge R4 of the voltage Q1. As discussed above, the falling edges of the first delayed pulse CLK_POS and the second delayed pulse CLK_NEG may be temporally aligned (e.g. synchronized) with falling edges of the second input clock signal CLK. These temporally-aligned falling edges are indicated in FIG. 3 as falling edges F1. In response to the falling edge F1 of the first delayed pulse CLK_POS, the first flip-flop 210 returns to the reset state, and thus, the voltage Q1 at the output pin Q of the first flip-flop 210 transitions from the logical HIGH to a logical LOW. This transition of the voltage Q1 at the output pin Q of the first flip-flop 210 is indicated in FIG. 3 as a falling edge F2 of the voltage Q1.

The second flip-flop 212 is configured to resample the voltage Q1 at the output pin Q of the first flip-flop 210 so that the output voltage $V_{OUT}$ is held at the voltage Q1 for one clock period. For example, as shown in the second clock period P2 in FIG. 3, in response to a rising edge R5 of the buffered clock signal CLK_SMPL, the voltage Q1 at the data input pin D of the second flip-flop 212 is clocked to the output pin Q of the second flip-flop 212. This results in a transition of the output voltage $V_{OUT}$ from a logical LOW to a logical HIGH (e.g. as depicted in FIG. 3 as a rising edge R6 of the output voltage $V_{OUT}$). The logical HIGH value of the output voltage $V_{OUT}$ is held for one clock period until the next rising edge R7 of the buffered clock signal CLK_SMPL.

As shown in FIG. 3, during the second clock period P2, when a rising edge R8 occurs in the second input clock signal CLK, the first input voltage $V_{IN1}$ is less than the second input voltage $V_{IN2}$. Since the first VCDL 202 and the second VCDL 204 are configured such that the delay added to the rising edge R8 of the second input clock signal CLK is inversely proportional to the amplitudes of the first input voltage $V_{IN1}$ and the second input voltage $V_{IN2}$, a rising edge R9 of the first delayed pulse CLK_POS arrives at the first flip-flop 210 later in time than a rising edge R10 of the second delayed pulse CLK_NEG. Consequently, the first flip-flop 210 is in a reset state when the rising edge R10 of the second delayed pulse CLK_NEG is received at the clock pin CP of the first flip-flop 210. Accordingly, the voltage Q1 at the output pin Q of the first flip-flop 210 is at a logical LOW (e.g. binary logic 0) regardless of the logical value at the data input pin D of the first flip-flop 210. Therefore, the voltage Q1 at the output pin Q of the first flip-flop 210 remains at a logical LOW (e.g. binary logic 0) following the falling edge F2 of the voltage Q1 and during the second clock period P2, as shown in FIG. 3.

As described above, the second flip-flop 212 is configured to resample the voltage Q1 at the output pin Q of the first flip-flop 210 so that the output voltage $V_{OUT}$ is held at the voltage Q1 for one clock period. For example, as shown in the third clock period P3 in FIG. 3, in response to the rising edge R7 of the buffered clock signal CLK_SMPL, the voltage Q1 at the data input pin D of the second flip-flop 212 is clocked to the output pin Q of the second flip-flop 212. This results in a transition of the output voltage $V_{OUT}$ from a logical HIGH to a logical LOW (e.g. as depicted in FIG. 3 as a falling edge F3 of the output voltage $V_{OUT}$). The logical LOW value of the output voltage $V_{OUT}$ is held for one clock period until the next rising edge R11 of the buffered clock signal CLK_SMPL.

In essence, the internal circuitry 200 shown in FIG. 2 converts (e.g. using the first VCDL 202 and the second VCDL 204) a voltage to a time delay, and the time delay is subsequently converted (e.g. by the first flip-flop 210 and the second flip-flop 212) to a digital signal (e.g. the output voltage $V_{OUT}$). As annotated in FIG. 3, in response to the first input voltage $V_{IN1}$ being greater than the second input voltage $V_{IN2}$ in the first clock period P1, the output voltage $V_{OUT}$ is at a logical HIGH (e.g. binary logic 1) in the second clock period P2. Additionally, in response to the first input voltage $V_{IN1}$ being less than the second input voltage $V_{IN2}$ in the second clock period P2, the output voltage $V_{OUT}$ is at a logical LOW (e.g. binary logic 0) in the third clock period P3. Consequently, the functionality of the comparator 100 described above in respect of FIG. 1 is achieved by the internal circuitry 200 shown in FIG. 2 and its associated timing diagram 300 shown in FIG. 3.

Figure 4:
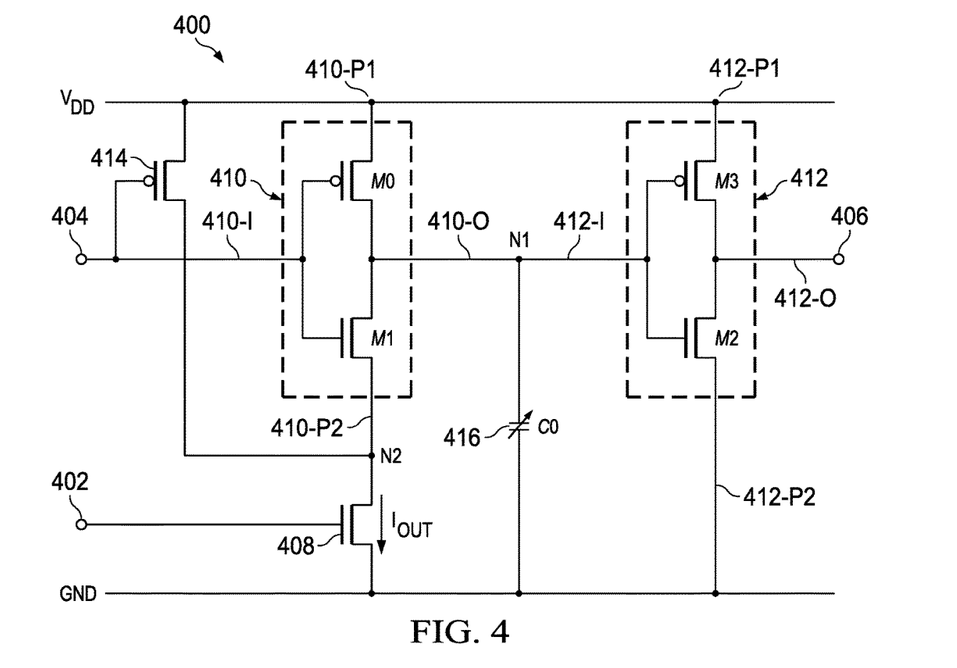
FIG. 4 shows a voltage-controlled delay line (VCDL) including a first input terminal, a second input terminal, and an output terminal, in accordance with an embodiment.

FIG. 4 shows a voltage-controlled delay line (VCDL) 400, in accordance with an embodiment. Each of the first VCDL 202 and the second VCDL 204 shown in FIG. 2 may be implemented using the VCDL 400 shown in FIG. 4. In other words, the first VCDL 202 and the second VCDL 204 may have identical circuitry in some embodiments. The VCDL 400 includes a first input terminal 402, a second input terminal 404, and an output terminal 406. The first input terminal 402 of the VCDL 400 may be identified with the first input terminals 202-1 and 204-1 of the first VCDL 202 and the second VCDL 204, respectively. The first input terminal 402 may be configured to receive an input voltage (e.g. the first input voltage $V_{IN1}$ or the second input voltage $V_{IN2}$). The second input terminal 404 of the VCDL 400 may be identified with the second input terminals 202-2 and 204-2 of the first VCDL 202 and the second VCDL 204, respectively. The second input terminal 404 may be configured to receive a clock signal (e.g. the second input clock signal CLK).

The VCDL 400 includes a current source 408. In the example shown in FIG. 4, the current source 408 is a voltage-controlled current source that outputs a current $I_{OUT}$ in response to a voltage applied at the first input terminal 402. Illustratively, the current $I_{OUT}$ may be proportional to the voltage applied at the first input terminal 402. In the embodiment depicted in FIG. 4, the current source 408 is implemented using a field-effect transistor in which the first input terminal 402 is coupled or tied to a gate terminal of the field-effect transistor. Therefore, the voltage applied at the first input terminal 402 modulates a channel of the field-effect transistor such that the current $I_{OUT}$ outputted from the field-effect transistor is proportional to the voltage applied at the first input terminal 402.

The VCDL 400 includes a first inverter 410 and a second inverter 412, which are coupled in series. In particular, an output terminal 410-O of the first inverter 410 is coupled to an input terminal 412-I of the second inverter 412, thereby forming a node N1. An output terminal 412-O of the second inverter 412 may be the output terminal 406 of the VCDL 400, as shown in FIG. 4. The first inverter 410 includes a first power terminal 410-P1 that is coupled to a first supply voltage $V_{DD}$. The first inverter 410 also includes a second power terminal 410-P2. The current source 408 may be coupled between the second power terminal 410-P2 of the first inverter 410 and a second supply voltage GND. In some embodiments, the second supply voltage GND may be a ground potential (e.g. substantially 0 V). Additionally, the second supply voltage GND is less than the first supply voltage $V_{DD}$. As shown in FIG. 4, a node N2 is formed by coupling the second power terminal 410-P2 of the first inverter 410 to the current source 408. The second inverter 412 includes a first power terminal 412-P1 and a second power terminal 412-P2, which are coupled to the first supply voltage $V_{DD}$ and the second supply voltage GND, respectively.

The VCDL 400 further includes a switch 414 coupled between the first supply voltage $V_{DD}$ and the second power terminal 410-P2 of the first inverter 410. In the example shown in FIG. 4, the switch 414 is implemented using a PMOS transistor having a gate terminal coupled to the second input terminal 404 of the VCDL 400. As such, the switch 414 may be configured to allow the node N2 to charge to the first supply voltage $V_{DD}$ when a voltage applied at the second input terminal 404 of the VCDL 400 is substantially equal to 0 V. In this way, a floating state at the node N2 is prevented. The VCDL 400 additionally includes a capacitive element 416 coupled between the node N1 and the second supply voltage GND. The capacitive element 416 may be a trimmable or programmable capacitive element having an effective capacitance Co.

As described above in respect of FIGS. 2 and 3, the delay added to the rising edge of the second input clock signal CLK may be inversely proportional to the amplitudes of the first input voltage $V_{IN1}$ and the second input voltage $V_{IN2}$. In connection with the VCDL 400 shown in FIG. 4, the delay added to the rising edge of the clock signal at the second input terminal 404 is inversely proportional to the voltage applied at the first input terminal 402. In other words, the rising edge delay from the second input terminal 404 to the output terminal 406 of the VCDL 400 may be modulated by the voltage applied at the first input terminal 402 of the VCDL 400.

When a rising edge of a clock signal arrives at the second input terminal 404 of the VCDL 400, the switch 414 decouples the node N2 from the first supply voltage $V_{DD}$. Additionally, the node N1 is coupled to the node N2, and the charge stored in the capacitive element 416 discharges through the current source 408. A larger voltage applied at the first input terminal 402 results in a larger current $I_{OUT}$, and thus, a faster discharge of the capacitive element 416. Conversely, a lower voltage applied at the first input terminal 402 results in a smaller current $I_{OUT}$, and thus, a slower discharge of the capacitive element 416. When the capacitive element 416 is discharged, the potential at the node N1 becomes smaller than the input switching threshold voltage of the second inverter 412, thereby coupling the output terminal 412-O of the second inverter 412 to the first power supply voltage VDD, which, in turn, triggers a logical HIGH at the output terminal 406 of the VCDL 400. Consequently, it can be seen that a larger voltage at the first input terminal 402 results in a faster discharge of the capacitive element 416 and a shorter rising edge delay from the second input terminal 404 to the output terminal 406 of the VCDL 400.

Figure 5:
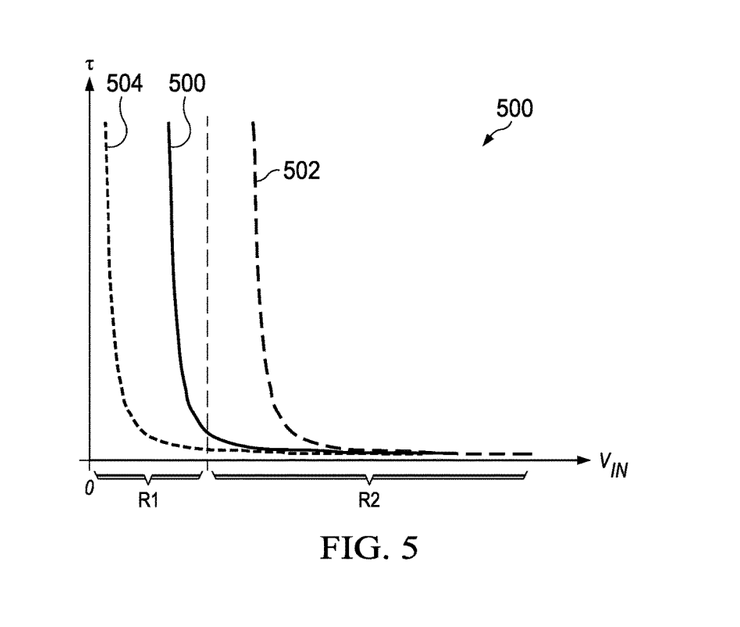
FIG. 5 shows a graph that qualitatively illustrates the dependence of a delay between rising edges at the second input terminal and the output terminal of a VCDL on a voltage applied at the first input terminal of the VCDL, in accordance with an embodiment.

FIG. 5 shows a graph that qualitatively illustrates how a delay between a rising edge at the second input terminal 404 and a rising edge at the output terminal 406 of the VCDL 400 varies with a voltage applied at the first input terminal 402 of the VCDL 400, in accordance with an embodiment. The rising edge delay from the second input terminal 404 to the output terminal 406 of the VCDL 400 is indicated in FIG. 5 as a delay T, which is plotted on the vertical axis. Additionally, the voltage applied at the first input terminal 402 of the VCDL 400 is indicated in FIG. 5 as $V_{IN}$, which is plotted on the horizontal axis. As depicted in the curve 500 in FIG. 5, a lower voltage $V_{IN}$ (e.g. in range R1 of the horizontal axis) results in a longer absolute delay T between a rising edge at the second input terminal 404 of the VCDL 400 and a rising edge at the output terminal 406 of the VCDL 400. In such an example, the VCDL 400 may have a slower speed and may be used in low frequency applications (such as ADCs that require high accuracy, but do not require high speed). Nonetheless, a lower voltage $V_{IN}$ results in a higher sensitivity for the VCDL 400 since a small change in the voltage $V_{IN}$ results in a large change in the delay T between a rising edge at the second input terminal 404 of the VCDL 400 and a rising edge at the output terminal 406 of the VCDL 400.

Conversely, as depicted in the curve 500 in FIG. 5, a higher voltage $V_{IN}$ (e.g. in range R2 of the horizontal axis) results in a shorter delay T between a rising edge at the second input terminal 404 of the VCDL 400 and a rising edge at the output terminal 406 of the VCDL 400. In such an example, the VCDL 400 may have a higher speed and may be used in high frequency applications (such as ADCs that require high speed, but do not require high accuracy). Nonetheless, a higher voltage $V_{IN}$ results in a lower sensitivity for the VCDL 400 since a large change in the voltage $V_{IN}$ results in a small change in the delay T between a rising edge at the second input terminal 404 of the VCDL 400 and a rising edge at the output terminal 406 of the VCDL 400.

The rising edge delay from the second input terminal 404 to the output terminal 406 of the VCDL 400 may also be modulated by the effective capacitance Co of the capacitive element 416. For example, a larger effective capacitance Co of the capacitive element 416 results in greater charge being stored in the capacitive element 416, and, consequently, a slower discharge of the capacitive element 416 for a given voltage $V_{IN}$ applied at the first input terminal 402 of the VCDL 400. Qualitatively, this may be represented by a shift of the curve 500 to the right (e.g. depicted as curve 502 in FIG. 5). On the other hand, a smaller effective capacitance Co of the capacitive element 416 results in smaller charge being stored in the capacitive element 416, and, consequently, a faster discharge of the capacitive element 416 for a given voltage $V_{IN}$ applied at the first input terminal 402 of the VCDL 400. Qualitatively, this may be represented by a shift of the curve 500 to the left (e.g. depicted as curve 504 in FIG. 5). The effective capacitance Co chosen for the capacitive element 416 depends on various factors, such as the maximum or minimum tolerable delay for a given application, the particular application or circuit in which the comparator 100 is used, and design constraints (e.g. maximum or minimum tolerable voltage $V_{IN}$). The effective capacitance Co may also depend, at least in part, on a process, voltage, and temperature (PVT) mismatch between the first VCDL 202 and the second VCDL 204, as described below in respect of FIG. 6.

Referring back to FIG. 1, in response to the first input voltage $V_{IN1}$ being greater than the second input voltage $V_{IN2}$, the output voltage $V_{OUT}$ may be at a first logic level (e.g. logical HIGH or binary logic 1). On the other hand, the output voltage $V_{OUT}$ may be at a second logic level (e.g. logical LOW or binary logic 0) in response to the first input voltage $V_{IN1}$ being less than the second input voltage $V_{IN2}$. As such, the accuracy of the comparator 100 depends, at least in part, on the ability of the comparator 100 to determine a difference between the first input voltage $V_{IN1}$ and the second input voltage $V_{IN2}$. However, as shown in FIG. 2, the first input voltage $V_{IN1}$ and the second input voltage $V_{IN2}$ are applied as inputs to the first VCDL 202 and the second VCDL 204, respectively. As such, a mismatch in the calibration of the first VCDL 202 relative to the second VCDL can result in an offset voltage between the first input terminal 102 and the second input terminal 104 of the comparator 100. For example, a mismatch between the first VCDL 202 and the second VCDL 204 can result in a 1 mV offset voltage between the first input terminal 102 and the second input terminal 104 of the comparator 100 (e.g. where the second input terminal 104 is at a higher potential than the first input terminal 102). In such an example, even if the first input voltage $V_{IN1}$ is about 0.5 mV greater than the second input voltage $V_{IN2}$, the effective voltage difference between the first input terminal 102 and the second input terminal 104 of the comparator 100 is about 0.5 mV, with the second input terminal 104 being at a greater potential than the first input terminal 102. Consequently, the comparator 100 may erroneously output a logical LOW at the output terminal 106 even though the first input voltage $V_{IN1}$ is greater than the second input voltage $V_{IN2}$. Accordingly, the mismatch between the first VCDL 202 and the second VCDL 204 needs to be compensated on a per part basis in order for accurate operation of the comparator 100.

The mismatch between the first VCDL 202 and the second VCDL 204 may be dependent of PVT variations between the first VCDL 202 and the second VCDL 204. In other words, the offset voltage between the first input terminal 102 and the second input terminal 104 of the comparator 100 may be PVT dependent. In order to compensate for temperature and voltage variations between the first VCDL 202 and the second VCDL 204, the first VCDL 202 and the second VCDL 204 can be placed next to each other in a circuit layout (e.g. in a silicon layout) and can be coupled to the same power source. Consequently, the power supplied to the first VCDL 202 and the second VCDL 204 and the temperature experienced by the first VCDL 202 and the second VCDL 204 may have substantially no difference, thereby compensating for the voltage and temperature variations between the first VCDL 202 and the second VCDL 204. The silicon process mismatch between the first VCDL 202 and the second VCDL 204 may be compensated by selecting appropriate effective capacitances Co for the capacitive elements 416 of each of the first VCDL 202 and the second VCDL 204, as described below in respect of FIG. 6.

FIG. 6 shows a method 600 of determining the effective capacitances Co of the capacitive elements 416 of each of the first VCDL 202 and the second VCDL 204 to compensate for silicon process mismatches between the first VCDL 202 and the second VCDL 204, in accordance with an embodiment. The method 600 includes applying an identical voltage to the first input terminal 102 and the second input terminal 104 of the comparator 100 (in step 602). Since the same voltage is applied to the first input terminal 102 and the second input terminal 104 of the comparator 100, the logic state produced at the output terminal 106 of the comparator 100 can be attributed to the offset voltage between the first input terminal 102 and the second input terminal 104. The method 600 also includes setting the effective capacitance Co of the capacitive element 416 of the second VCDL 204 of the comparator 100 (in step 604). For example, the capacitive element 416 of the second VCDL 204 may have a minimum capacitance $C_{MIN}$ and a maximum capacitance $C_{MAX}$. In step 604, the effective capacitance Co of the capacitive element 416 of the second VCDL 204 may be set to be a capacitance that is in the middle of the range spanned by the minimum capacitance $C_{MIN}$ and the maximum capacitance $C_{MAX}$. The method 600 further includes varying the effective capacitance Co of the capacitive element 416 of the first VCDL 202 of the comparator 100 from the minimum capacitance $C_{MIN}$ to the maximum capacitance $C_{MAX}$ (in step 606). In effect, step 606 sweeps the rising edge delays that may be provided by the first VCDL 202. The method 600, in step 608, includes setting the effective capacitance Co of the capacitive element 416 of the first VCDL 202 of the comparator 100 to the capacitance that causes the comparator 100 to trigger (e.g. to change the logic state of the output voltage $V_{OUT}$ at the output terminal 106 of the comparator 100). By causing the comparator 100 to trigger, the logic state produced by the offset voltage at the output terminal 106 of the comparator 100 is reversed, thereby compensating for silicon process mismatches between the first VCDL 202 and the second VCDL 204.

The above-described compensation of PVT variations between the first VCDL 202 and the second VCDL 204 may result in increased accuracy of the comparator 100 since small differential voltages (e.g. about 1 mV or below) are sufficient to correctly trigger an output voltage at the output terminal 106 of the comparator 100. As an example, the comparator 100 may be able to operate accurately at about 125 MHz even when a difference between the first input voltage $V_{IN1}$ and the second input voltage $V_{IN2}$ is about 1 mV. Additionally, the internal circuitry 200 of the comparator 100 is implemented using a relatively small number of elements, and it does not require analog amplifiers, which usually require larger voltage headroom for correct circuit operation. As such, the circuit for the comparator 100 consumes low power, requires a low supply voltage, and has low design complexity.

FIG. 7 shows a method 700 of generating the output voltage $V_{OUT}$ based on a comparison of the first input voltage $V_{IN1}$ and the second input voltage $V_{IN2}$, in accordance with an embodiment. In particular, the method 700 summarizes the operation of the internal circuitry 200 shown in FIG. 2 in conjunction with the timing diagram 300 shown in FIG. 3. The method 700 includes delaying, by a first voltage-controlled delay line (VCDL), a rising edge of a clock signal by a first time delay based on a first input voltage received by the first VCDL, where the delaying produces a first delayed signal (in 702). The method 700 further includes delaying, by a second VCDL, the rising edge of the clock signal by a second time delay based on a second input voltage received by the second VCDL, where the delaying produces a second delayed signal (in 704). The method 700 additionally includes triggering a reset pin of the first flip-flop using the first delayed signal (in 706) and triggering a clock pin of a first flip-flop using the second delayed signal (in 708).

In an embodiment, a circuit includes a first voltage-controlled delay line (VCDL), a second VCDL, and a first flip-flop. The first VCDL includes a first input terminal configured to receive a first input voltage, and a second input terminal configured to receive a clock signal. The second VCDL includes a first input terminal configured to receive a second input voltage, and a second input terminal configured to receive the clock signal. The first flip-flop includes a reset pin coupled to an output terminal of the first VCDL, and a clock pin coupled to an output terminal of the second VCDL.

In an embodiment, a circuit includes a first voltage-controlled delay line (VCDL). The first VCDL includes a first inverter; a second inverter; a first capacitive element; a first current source; and a first switch. The first inverter includes an input configured to receive a clock signal, and a first power terminal configured to be coupled to a first supply voltage. The second inverter includes an input coupled to an output of the first inverter, a first power terminal configured to be coupled to the first supply voltage, and a second power terminal configured to be coupled to a ground potential. The first capacitive element is coupled between an output of the first inverter and the ground potential. The first current source is coupled between a second power terminal of the first inverter and the ground potential, where the first current source is configured to be controlled by a first input voltage. The first switch is coupled between the first supply voltage and the second power terminal of the first inverter, where the first switch is configured to be controlled by the clock signal, and where an output of the second inverter is an output of the first VCDL.

In an embodiment, a method includes delaying, by a first voltage-controlled delay line (VCDL), a rising edge of a clock signal by a first time delay based on a first input voltage received at the first VCDL, where the delaying produces a first delayed signal. The method also includes delaying, by a second VCDL, the rising edge of the clock signal by a second time delay based on a second input voltage received at the second VCDL, where the delaying produces a second delayed signal. The method additionally includes triggering a reset pin of a first flip-flop using the first delayed signal; and triggering a clock pin of the first flip-flop using the second delayed signal.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
a first voltage-controlled delay line (VCDL) comprising a first input terminal configured to receive a first input voltage, and a second input terminal configured to receive a clock signal;
a second VCDL comprising a first input terminal configured to receive a second input voltage, and a second input terminal configured to receive the clock signal;
a first flip-flop comprising a reset pin coupled to an output terminal of the first VCDL, and a clock pin coupled to an output terminal of the second VCDL;
a second flip-flop having a data input pin coupled to an output pin of the first flip-flop; and
a third flip-flop having a data input pin and a reset pin configured to receive an enable signal, a clock pin configured to receive the clock signal, and an output pin coupled to a reset pin of the second flip-flop.

2. The circuit of claim 1, wherein the first VCDL is configured to generate a first delayed pulse at the output terminal of the first VCDL in response to the first input voltage, wherein a rising edge of the first delayed pulse is delayed in time relative to a rising edge of the clock signal.

3. The circuit of claim 2, wherein a falling edge of the first delayed pulse is temporally aligned with a falling edge of the clock signal.

4. The circuit of claim 2, wherein a delay between the rising edge of the first delayed pulse and the rising edge of the clock signal is inversely proportional to an amplitude of the first input voltage.

5. The circuit of claim 1, wherein the second VCDL is configured to generate a second delayed pulse at the output terminal of the second VCDL in response to the second input voltage, wherein a rising edge of the second delayed pulse is delayed in time relative to a rising edge of the clock signal.

6. The circuit of claim 5, wherein a delay between the rising edge of the second delayed pulse and the rising edge of the clock signal is inversely proportional to an amplitude of the second input voltage.

7. The circuit of claim 1, wherein the first flip-flop is configured to generate an output voltage in response to a difference between the first input voltage and the second input voltage.

8. The circuit of claim 7, wherein the output voltage of the first flip-flop is at a first logical value in response to the first input voltage being greater than the second input voltage, and wherein the output voltage of the first flip-flop is at a second logical value in response to the first input voltage being less than the second input voltage.

9. The circuit of claim 1, wherein the first flip-flop further comprises a data input pin configured to receive a constant input logical value.

10. A circuit, comprising:
a first voltage-controlled delay line (VCDL) comprising:
a first inverter having an input configured to receive a clock signal, and a first power terminal configured to be coupled to a first supply voltage;
a second inverter having an input coupled to an output of the first inverter, a first power terminal configured to be coupled to the first supply voltage, and a second power terminal configured to be coupled to a ground potential;
a first capacitive element coupled between an output of the first inverter and the ground potential;
a first current source coupled between a second power terminal of the first inverter and the ground potential, wherein the first current source is configured to be controlled by a first input voltage; and
a first switch coupled between the first supply voltage and the second power terminal of the first inverter, wherein the first switch is configured to be controlled by the clock signal, and wherein an output of the second inverter is an output of the first VCDL.

11. The circuit of claim 10, further comprising:
a second VCDL comprising:
a third inverter having an input configured to receive the clock signal, and a first power terminal configured to be coupled to the first supply voltage;
a fourth inverter having an input coupled to an output of the third inverter, a first power terminal configured to be coupled to the first supply voltage, and a second power terminal configured to be coupled to the ground potential;
a second capacitive element coupled between an output of the third inverter and the ground potential;
a second current source coupled between a second power terminal of the third inverter and the ground potential, wherein the second current source is configured to be controlled by a second input voltage; and
a second switch coupled between the first supply voltage and the second power terminal of the third inverter, wherein the second switch is configured to be controlled by the clock signal, and wherein an output of the fourth inverter is an output of the second VCDL.

12. The circuit of claim 11, wherein at least one of the first capacitive element or the second capacitive element comprises a programmable capacitor.

13. The circuit of claim 11, further comprising a first flip-flop having a reset pin coupled to the output of the second inverter, and a clock pin coupled to the output of the fourth inverter.

14. The circuit of claim 13, further comprising a second flip-flop having a data input pin coupled to an output pin of the first flip-flop.

15. The circuit of claim 14, further comprising a third flip-flop having a data input pin and a reset pin configured to receive an enable signal, a clock pin configured to receive the clock signal, and an output pin coupled to a reset pin of the second flip-flop.

16. A method, comprising:
delaying, by a first voltage-controlled delay line (VCDL), a rising edge of a clock signal by a first time delay based on a first input voltage received at the first VCDL, wherein the delaying produces a first delayed signal;
delaying, by a second VCDL, the rising edge of the clock signal by a second time delay based on a second input voltage received at the second VCDL, wherein the delaying produces a second delayed signal;
triggering a reset pin of a first flip-flop using the first delayed signal;
triggering a clock pin of the first flip-flop using the second delayed signal;
sampling, using a data pin of a second flip-flop, an output of the first flip-flop;
triggering a clock pin of a third flip-flop using the clock signal;
triggering a reset pin and a data input pin of the third flip-flop using an enable signal; and
triggering a reset pin of the second flip-flop using an output of the third flip-flop.

17. The method of claim 16, wherein the output of the first flip-flop is at a first logical value in response to the first input voltage being greater than the second input voltage, and wherein the output of the first flip-flop is at a second logical value in response to the first input voltage being less than the second input voltage.

18. The method of claim 16, further comprising:
providing a constant voltage to a data input pin of the first flip-flop.

19. The method of claim 16, wherein the first time delay and the second time delay are inversely proportional to an amplitude of the first input voltage and an amplitude of the second input voltage, respectively.

20. The method of claim 16, further comprising:
generating the clock signal by delaying and inverting a buffered clock signal; and
triggering a clock pin of the second flip-flop using the buffered clock signal.

* * * * *